United States Patent
Hausmann (10) Patent No.: US 10,514,715 B2
(45) Date of Patent: Dec. 24, 2019

(54) PARTITIONING OF A CHIP SUPPORTING A SW-CONTROL ARCHITECTURE FOR INDUCTIVE LOADS

(71) Applicant: Infineon Technologies AG, Neubiberg (DE)

(72) Inventor: Michael Hausmann, Gleisdorf (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 14/629,499

(22) Filed: Feb. 24, 2015

(65) Prior Publication Data

US 2016/0246314 A1 Aug. 25, 2016

(51) Int. Cl.
*G05F 1/46* (2006.01)
*H03K 7/08* (2006.01)

(52) U.S. Cl.
CPC .............. *G05F 1/463* (2013.01); *H03K 7/08* (2013.01)

(58) Field of Classification Search
CPC ........ G11B 5/02; G11B 5/022; H03K 17/601; H03K 17/64; H03K 17/691; H03K 17/731; H03M 1/66; H03M 1/12
USPC .......................................................... 327/110
See application file for complete search history.

(56) References Cited

U.S. PATENT DOCUMENTS

| | | | | |
|---|---|---|---|---|
| 2006/0001408 A1* | 1/2006 | Southwell | ........... | H02M 3/1584 323/282 |
| 2009/0121908 A1* | 5/2009 | Regier | ............... | G01R 31/2841 341/142 |
| 2009/0141347 A1* | 6/2009 | Mehrl | ................... | G03B 21/56 359/446 |
| 2009/0168563 A1* | 7/2009 | Jiang | ..................... | G11C 7/1051 365/193 |
| 2011/0248685 A1* | 10/2011 | Khan | ...................... | H02J 7/345 320/167 |
| 2013/0154071 A1* | 6/2013 | Haigh | ............... | H01L 23/49503 257/676 |
| 2014/0055063 A1* | 2/2014 | Peterson | ................. | H02P 27/04 318/400.2 |
| 2014/0266092 A1* | 9/2014 | Ueunten | ............... | H02M 3/158 323/271 |
| 2015/0369603 A1* | 12/2015 | Nakamura | ......... | G01C 19/5776 73/504.12 |

FOREIGN PATENT DOCUMENTS

| | | |
|---|---|---|
| CN | 101741233 A | 6/2010 |
| CN | 103513695 A | 1/2014 |
| CN | 103575401 A | 2/2014 |

OTHER PUBLICATIONS

Texas Instruments (ADS7822-Q1 datasheet, Mar. 2009 ).*

* cited by examiner

*Primary Examiner* — Patrick C Chen
(74) *Attorney, Agent, or Firm* — Slater Matsil, LLP (57) ABSTRACT

A current control system is disclosed. The current control system may include a controller configured to provide a control signal, an A/D converter dedicated to the controller, a driver configured to supply a current based on the control signal and a sensor configured to provide a digital signal representative of the current to the controller. The digital signal may bypass the dedicated A/D converter. A method for controlling current is likewise disclosed. A circuit for controlling current through an inductive load is likewise disclosed.

25 Claims, 9 Drawing Sheets

PARTITIONING OF A CHIP SUPPORTING A SW-CONTROL ARCHITECTURE FOR INDUCTIVE LOADS

TECHNICAL FIELD

Various embodiments relate to a new partitioning of a chip and a method for controlling current. This new partitioning may be applicable, in particular, in the control of current through inductive loads in the automobile transmission field.

BACKGROUND

Controlling a predetermined current through inductive loads is typically carried out with a pulse width modulation (PWM) approach. The average current through the load is measured and the duty cycle (DC) adjusted accordingly so that the resulting average load current $I_{LOAD}$ corresponds to the predetermined current set point $I_{SET}$.

In particular, a maximum allowable error of the controlled load current $I_{LOAD}$ for automobile transmission applications is limited to less than 1% of the predetermined current set point $I_{SET}$.

SUMMARY

In various embodiments, a current control system is provided. The current control system may include a controller configured to provide a control signal, an A/D converter dedicated to the controller, a driver configured to supply a current based on the control signal, and a sensor configured to provide a digital signal representative of the current to the controller. In various embodiments, the digital signal bypasses the dedicated A/D converter.

In various embodiments, a method for controlling current is provided. The method may include generating a control signal by means of a controller having a A/D converter dedicated thereto, providing the control signal to a driver configured to supply a current based on the control signal, generating a digital signal representative of the current, providing the digital signal to controller. In various embodiments, the digital signal bypasses the A/D converter.

In various embodiments, a circuit for controlling current through an inductive load is provided. The circuit may include a driver configured to adjust current flow to the inductive load, a microcontroller configured to control the driver, a first A/D converter located on a die configured to feed a digital signal to the microcontroller representative of the current flow to the inductive load, a second A/D converter coupled to the microcontroller. In various embodiments the second A/D converter is arranged off-die.

In various embodiments, a method for adjusting current flowing through an inductive load is provided. The method may include feeding a signal from a microcontroller to control current flow through an inductive load, converting on a die the current flow through the inductive load to a representative digital signal, feeding the digital signal to the microcontroller, and adjusting the signal from the microcontroller based on the converted signal.

In various embodiments, a method of monitoring current flowing through an inductive load driven through a bridge power stage in a pulse width modulation (PWM) mode is provided. The method may include feeding a first signal from a microcontroller, driving a switch which controls the current flowing through the inductive load using the signal, converting the current to a representative digital signal, feeding the representative digital signal to the microcontroller, adjusting the first signal based on the representative digital signal, dedicating an off-die A/D converter to the microcontroller.

In various embodiments, a circuit for controlling current through an inductive load is provided. The circuit may include a first and second die, a switch configured to pass current to the inductive load, a driver located on the first die configured drive a switch, a microcontroller located on the second die configured to control the driver. In various embodiments the microcontroller receives digital information about the current being passed to the load from the first die.

BRIEF DESCRIPTION OF THE DRAWINGS

In the drawings, like reference characters generally refer to the same parts of the disclosure throughout the different views. The drawings are not necessarily to scale, emphasis instead generally being placed upon illustrating the principles of the disclosure. In the following description, various embodiments of the disclosure are described with reference to the following drawings, in which.

DESCRIPTION

The following detailed description refers to the accompanying drawings that show, by way of illustration, specific details and embodiments in which the disclosure may be practiced.

The word "exemplary" is used herein to mean "serving as an example, instance, or illustration." Any embodiment or design described herein as "exemplary" is not necessarily to be construed as preferred or advantageous over other embodiments or designs.

The term "off-die" as used herein means any area exclusive of the chip package or die which is referenced. The off-die domain may include, for example, another die or another substrate on which the chip package or die is located.

The term "environmentally coupled" as used herein means that a referenced object and the coupled object share the same ambient environment. In the case of temperature sensing, for example, an environmentally coupled reference object and a temperature sensor coupled thereto would change closely together, or in lock-step, with each other in regard to temperature changes including those originating at the reference object.

The term "safety signal" as used herein means a signal that originates from a redundant signal source to a reference, or primary, signal. For example, a "safety signal" may be measurement of the same parameter as the primary signal but may be processed through a different, i.e. redundant, signal path. More particularly, an analog signal may be provided to a controller independently of a primary digital signal converted from the analog signal. In the event of failure in the digital signal processing, the analog signal may serve as a safety or back-up therefor. A further example of a safety signal is a signal that prevents a specific hazard such as the ASIL level according to ISO26262.

In various embodiments, a current control system comprising a controller configured to provide a control signal, an A/D converter dedicated to the controller, a driver configured to supply a current based on the control signal and a sensor configured to provide a digital signal representative of the current to the controller, wherein the digital signal bypasses the dedicated A/D converter is provided.

The low tolerance for error as described above in connection with, for example, auto transmission applications presents difficulties in the design of chips and requires new solutions for partitioning and electronic circuits in order to satisfy such strict accuracy requirements.

Figure 1:
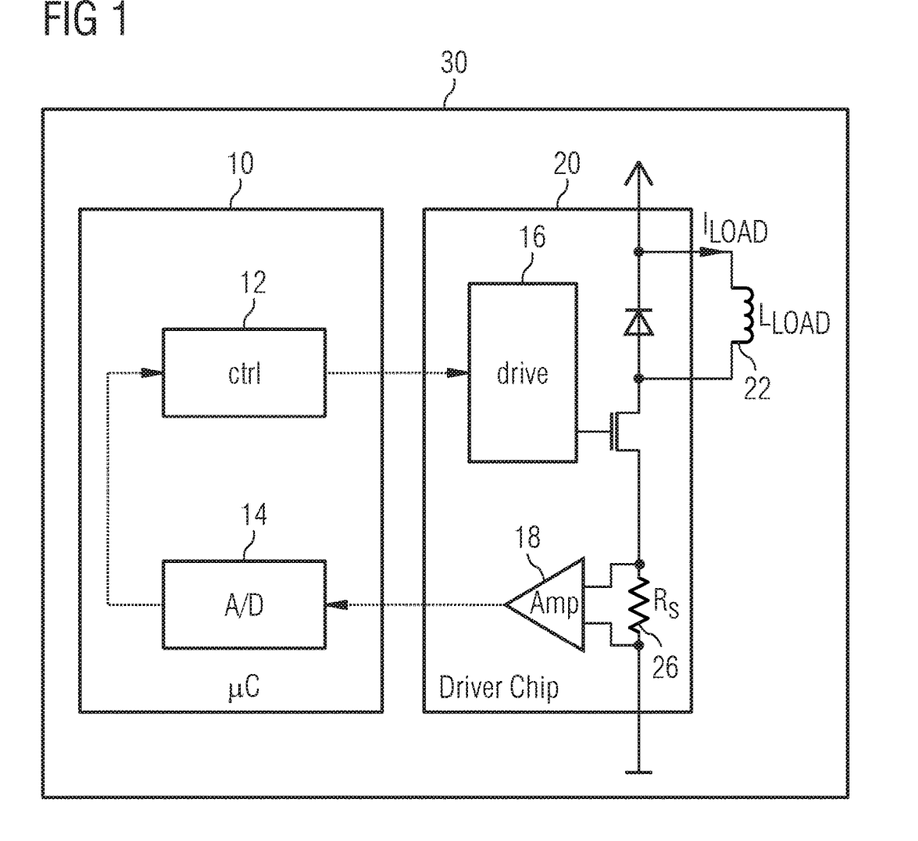
FIG. 1 shows, in accordance with a potential embodiment, SW control architecture.

For most applications, two approaches to partitioning are predominately used. FIG. 1 illustrates the first approach, the so-called "SW (software)-control" approach. In system 1, Two dies, i.e. microprocessor (μC) die 10 and driver chip 20, have been illustrated in FIG. 1, the dies being located on substrate 30. Substrate 30 may be a printed circuit board (PCB). Controller 12 and A/D converter 14 dedicated thereto may be located on microprocessor die 10 using the SW-control approach. Driver 16, on the other hand, may be located on driver chip 20 and connected to switch 24 which may also be located on driver chip 20. Controller 12 may provide a signal, and in particular a PWM signal, to driver 16 which then renders switch 24 conducting or non-conducting. The current passing through switch 24 may be measured using shunt resistor 26. Shunt resistor 24 may be directly or indirectly connected through the same current flow as switch 24 and may be internal or external to system 1. Current determiner 18 embodied as operational amplifier in FIG. 1 outputs an amplified voltage proportional the current through shunt resistor 26 in the form of an analog signal to A/D converter 14 indicative of the current flowing through the switch. The current through switch 24 may also be the current provided to current $I_{LOAD}$ through inductor 20. The illustrated building blocks are either fully integrated or parts of a discrete circuit.

In the SW-control approach, a current control algorithm in controller 12, for example, a Proportional-Integral (PI)-controller may control the external power stage on driver chip 20 or current $I_{LOAD}$ through inductor 22. In operation, controller 12 may provide an input signal to driver 16, which may in turn be configured to control a gate on switch 24. Closing switch 24 allows current to pass through it and effectively to inductor 22. By contrast, opening switch 24 stops current from passing through and effectively halts current flow to inductor 22. In operation, the current passing through both switch 24 and inductor 22 ($I_{LOAD}$) may be measured, the measurement of the current being fed digitally by A/D converter back into controller 12 for analysis in the current control algorithm. Controller 12 then adjusts the opening and closing accordingly so that the resulting average load current $I_{LOAD}$ corresponds to the predetermined (by the user) current set point $I_{SET}$.

The current control loop is has been indicated with a dotted line in FIG. 1.

Figure 2:
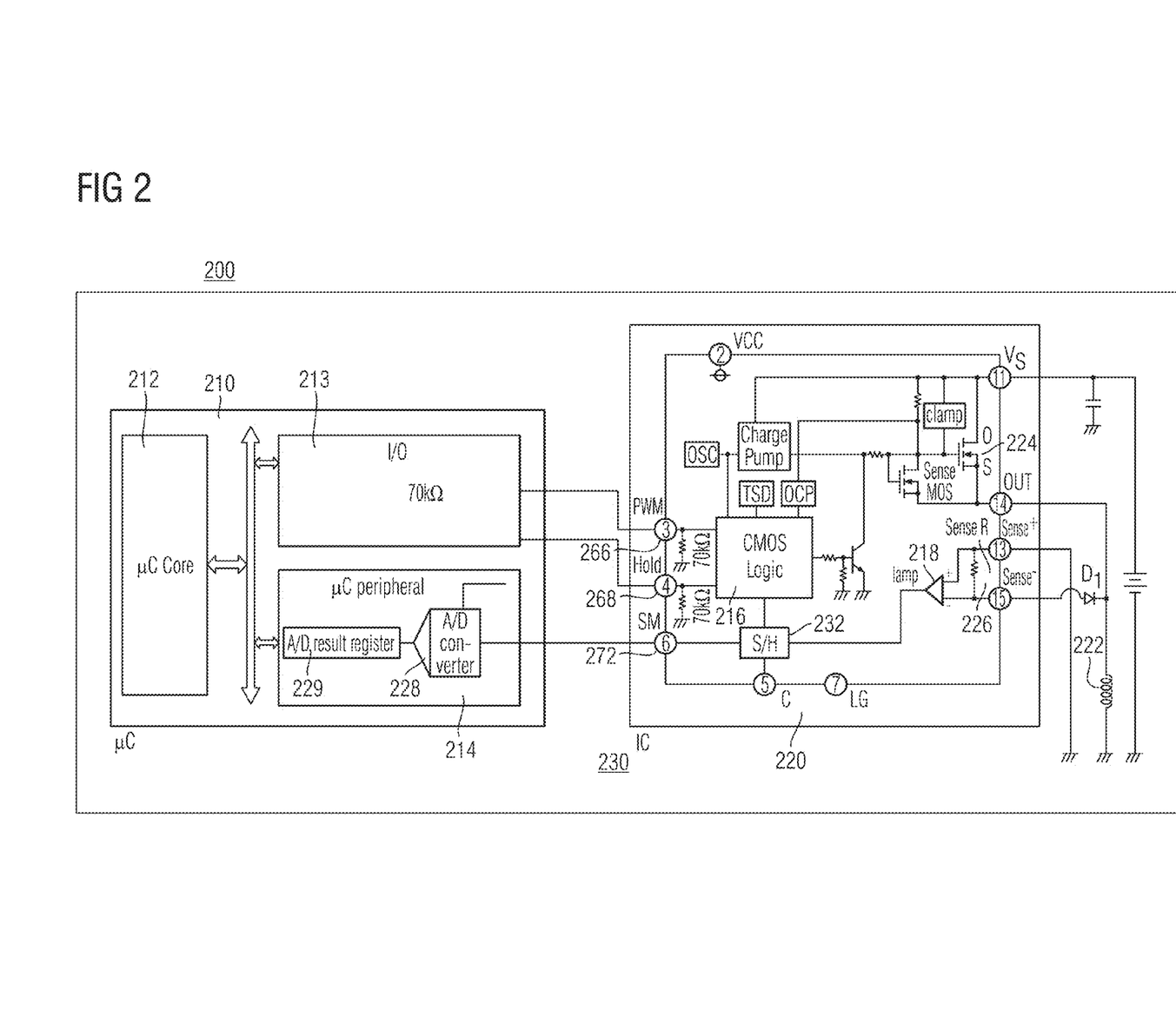
FIG. 2 shows, according to an embodiment, a mainly analog SW control chip.

FIG. 2 illustrates a SW (software)-control circuit schematic in detail. In system 200, two dies, i.e. microprocessor (μC) die 210 and driver chip 220, are located on substrate 230. Microprocessor die 210 comprises a microprocessor core 212, Input/Output (I/O) interface 213 and microprocessor peripheral 214 comprising A/D converter 228 and A/D result register 229. Microprocessor peripheral 214 may be dedicated to microprocessor core 212. Two outputs of I/O interface 213, designed to interact with microprocessor core 212, are connected to PWM input 266 and hold input 268 respectively on CMOS logic circuit 216 on driver chip 220. CMOS logic circuit 216 is configured to open and close switch 224, which provides current to load 222. In addition, the current passing through switch 224 may be measured off shunt resistor 226. Current determiner 218 embodied as operational amplifier Iamp in FIG. 2 outputs an amplified voltage proportional the current through shunt resistor 226. SW-control architecture may utilize a pure analog driver chip with a Sample & Hold (S&H) stage 232 to capture the measured differential voltage along a chip-internal or -external shunt resistor 226. The control of the Sample & Hold (S&H) stage 232 as well as the A/D data conversion is controlled by the microprocessor 210 in addition to the carrying out of the needed computations such as averaging, filtering, etc.

In the SW (software)-control approach of FIG. 2, a current control algorithm in microprocessor core 212, for example, a Proportional-Integral (PI)-controller may control the external power stage or the current $I_{LOAD}$ through inductor 222. In operation, microprocessor core 212 may provide an input signal, and in particular a PWM signal, to CMOS logic circuit 216. CMOS logic circuit 216 may then, based on the input signal, control the gate on switch 224, either opening or closing the switch. Closing switch 224 allows current to pass through it and effectively to inductor 222. By contrast, opening switch 224 stops current from passing through and effectively halts current to inductor 222. The current passing through switch 224 and inductor 222 ($I_{LOAD}$) may be measured, the measurement of the current being fed back into microprocessor core 212 for analysis in the current control algorithm. Microprocessor core 212 then adjusts the opening and closing accordingly so that the resulting average load current $I_{LOAD}$ corresponds to the predetermined (by the user) current set point $I_{SET}$.

Figure 3:
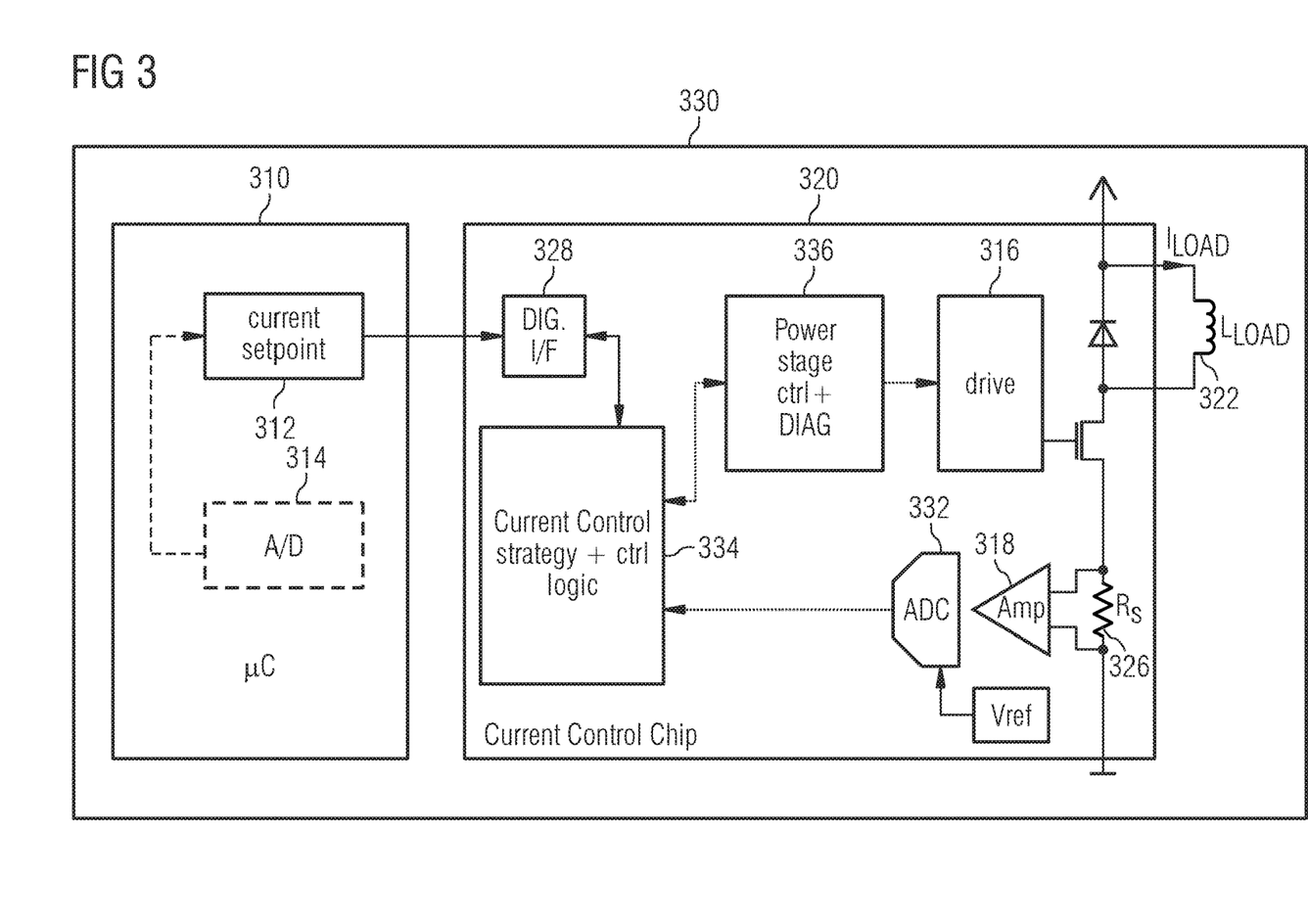
FIG. 3 shows, in accordance with a potential embodiment, HW control architecture.

FIG. 3 illustrates the second approach, the so-called "HW (Hardware)-control" approach. FIG. 3 illustrates two dies, i.e. microprocessor (μC) die 310 and current control chip 320, located on substrate 330. Substrate 330 may also be a printed circuit board (PCB). Current set point unit 312 and vestigial A/D converter 314 connected thereto may be located on microprocessor die 310. The current set point from current set point unit 312 is not derived from the current control chip 320. Digital Interface unit 328 may be located on current control chip 320 and connected to current control strategy and control logic unit 334. Unit 334 may be connected to power stage control and diagnostic unit 336. Unit 336 feeds a signal to driver 316 located on the current control chip 320 and connected to switch 324. The current passing through switch 324 may be measured off shunt resistor 326 connected upstream of the switch. Current determiner 318 outputs an amplified voltage proportional the current through shunt resistor 326 in the form of an analog signal to A/D converter 332 located on current control chip 320 indicative of the current flowing through the switch. The current through switch 324 may also be the current $I_{LOAD}$ through inductor 322.

In this approach, the current control algorithm and power stage are fully integrated in a separate chip, current control chip 320, from microcontrol chip 310. Current control chip 320 is fed with a set point $I_{SET}$ from current set point unit 312 on microcontroller 310 and delivers state and error information of the load in return. The HW-control approach delivers a current through the inductor 322 the approaches the set point more closely than the approaches illustrated in FIGS. 1 and 2.

The current control loop in FIG. 3 has been indicated with a dotted line.

Approximately fifty percent of the worldwide applications for transmission use the SW-control approach. There is currently a need for a new chip partitioning configured to support a SW-control approach.

Moreover, in contrast to the approaches described above, this new partitioning can achieve an accuracy of $I_{LOAD}$ similar to that found in HW-control architectures. Furthermore, this new partitioning may relieve the microcontroller of computational intensive measurement tasks or may allow use of the chips infrastructure for functional safety purposes.

One disadvantage of the SW-control approaches illustrated in FIGS. 1 and 2 is the low achievable accuracy (~5% error) due to limited possibility for calibration and compensation of non-ideal effects.

The new partitioning described below with reference to FIG. 4 maintains the flexibility of a current control algorithm running in a microprocessor such as microprocessor 10 illustrated in FIG. 1 while attaining an accurate controlled current $I_{LOAD}$ similar to the measurements found thus far only in HW-control approaches. Using the partitioning illustrated in FIG. 4, for example, may reduce error to <1%.

Furthermore, in the SW-control approaches illustrated in FIGS. 1 and 2, as explained above, the microprocessor 210 has to control both Sample & Hold stage 232 and A/D converter 218 in addition to carrying out the needed computations such as averaging, filtering, etc. These computations are added tasks for microprocessor 210 and require a larger, more powerful processor, which typically adds to the cost of the microprocessor.

Accordingly, a different partitioning of the functions for SW-control architecture may aid in the elimination or reduction of some of the disadvantages of the SW-control approaches illustrated in FIGS. 1 and 2.

Figure 4:
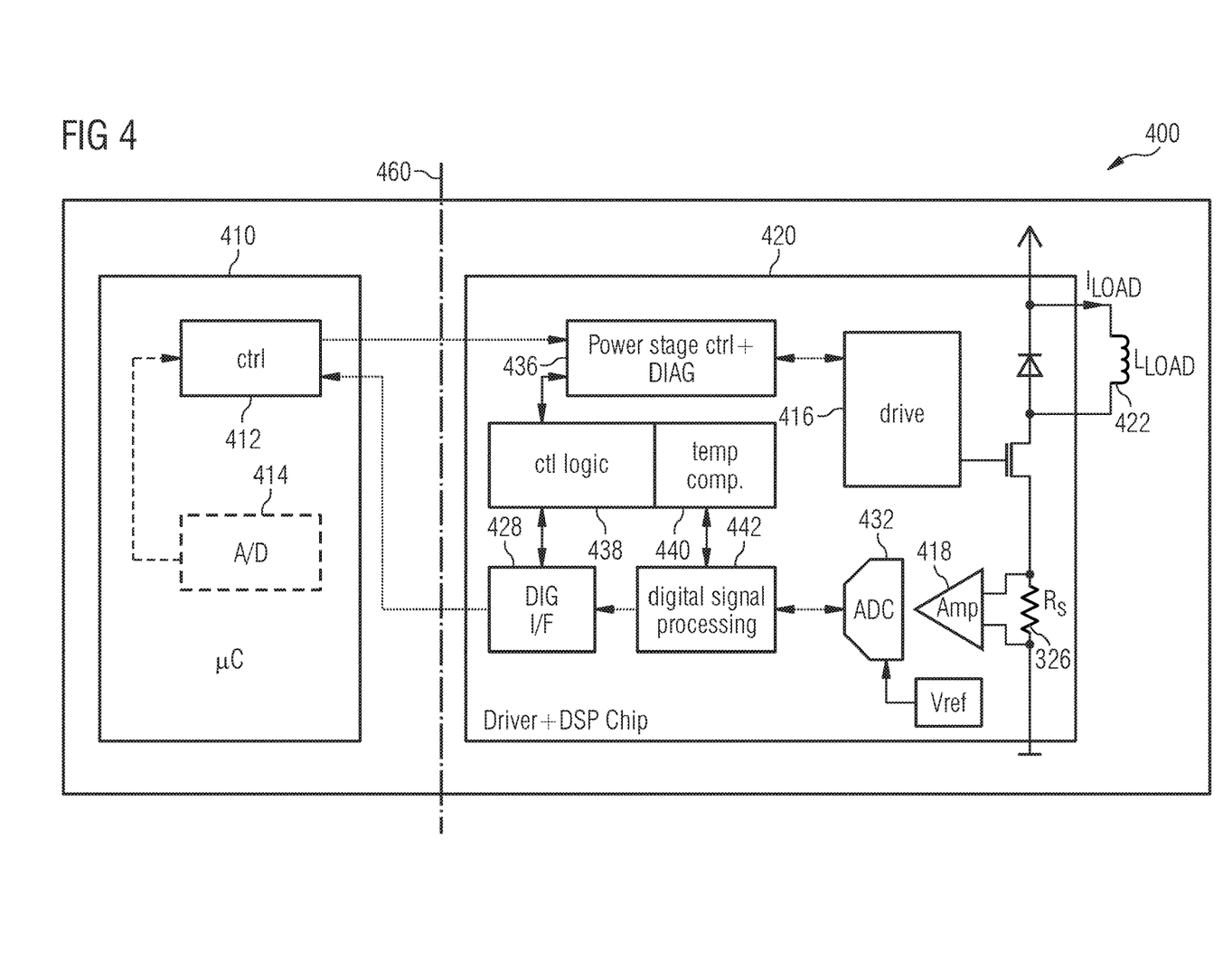
FIG. 4 shows, in accordance with a potential embodiment, a new partitioning for SW control architecture.

FIG. 4 illustrates one embodiment of a new approach for current control system 400. Two dies, i.e. microprocessor (μC) die 410 and driver and digital signal processing (DSP) chip 420, have been illustrated, the dies being located on substrate 430. Die 410 and chip 420 may alternatively be located on separate substrates (illustrated by cut line 460). Driver and DSP chip 420 may be a first die. Microprocessor die 410 may be a second die. Microprocessor die 410 may be the same or similar to microprocessor die 10 illustrated in FIG. 1. In addition, microprocessor die 410 may be a die package sold, for example, for the current control using the SW-control approach illustrated in FIG. 1. In other words, microprocessor die 410, upon which the controller and the dedicated A/D converter are located, may be a dedicated package.

Microprocessor die 410 or the second die may include controller 412 and A/D converter 414 located thereon. Controller 412 may be thermally isolated from driver 414. As used herein, thermal isolation means that a temperature rise in driver 414 will not result in a temperature rise in controller 412. Likewise, a temperature rise in controller 412 will not result in a temperature rise in driver 414. A/D converter 414 may be dedicated to the controller 412. In other words, A/D converter 410 may be permanently connected to controller 412. Controller 412 is connected with power stage control and diagnostic 436, which is in turn connected to driver 416 and control logic 438.

Power stage control and diagnostic 420 is connected to driver 416, which is located on driver and DSP chip 420 or the first die. Driver 416 is connected to switch 424. Driver 416 may be configured to supply the current through pulse width modulation of switch 424. In other words, driver 416 may control the opening and closing of switch 424 by modulating the pulses sent to the gate of switch 424. The current passing through switch 424 may be current $I_{LOAD}$ supplied to the inductive load 422. $I_{LOAD}$ may be measured off shunt resistor 426 connected upstream of the switch. Current determiner 418 embodied as operational amplifier in FIG. 4 determines the current through shunt resistor 426 and provides an analog signal representative of the current to A/D converter 432 located on driver and digital signal processing chip 420. A/D converter 432 may be separate from and a second or additional A/D converter to A/D converter 414. A/D converter 432 may be a first of multiple A/D converters. Together, switch 424, current determiner 418 and A/D converter 432 may be a sensor configured to provide a digital signal representative of the current $I_{LOAD}$ flowing through inductor 422. The digital signal output from A/D converter 432 may be preprocessed in digital signal processor 442, arranged on the first die, before being passed to controller 412. Preprocessing may include or exclusively include adjusting the digital signal outputted from A/D converter 432 to remove, e.g., external factors affecting the measurement of current $I_{LOAD}$ supplied to the inductive load 422. Digital signal processor 442 receives input from temperature compensation circuitry 440, which may be internal or external to the processor itself. Temperature compensation circuitry 440 may include a temperature sensor, which may be located on the first die, in the case of FIG. 4, on the driver and digital signal processing chip 420. Digital signal processor 442 may be configured to preprocess the digital signal in response to temperature changes of the circuit sensed by such a temperature sensor in temperature compensation circuitry 440. In certain embodiments, temperature compensation circuitry 440 is environmentally coupled to the chip or be configured sense temperature changes in the environment of the chip or any of the chip components that could interfere with an accurate representation of the current being passed to the load ($I_{LOAD}$). As such, digital signal processor 442 may remove the effects of temperature from the digital signal output from A/D converter 432. Digital signal processor 442 may include an E2PROM configured to hold temperature compensation data. The E2PROM may further hold calibration and compensation data that is written during production and end of line tests of the chip. This simplifies the implementation of the analog circuits due to reduced accuracy and temperature stability requirements, since a digital temperature dependent correction is able to compensate any non-ideal and non-linear effects. As illustrated in more detail in FIG. 5 below, a second analog signal derived from the current flow to the inductive load $I_{LOAD}$ may independently feed the dedicated A/D converter 414. Dedicated A/D converter 414 may be the second of multiple A/D converters and may be arranged off-die or off-die from driver and digital signal processing die 420. The second analog signal may be a safety signal.

In operation, controller 412, located off-die in FIG. 4, is configured to provide a control signal. Controller 412 may provide multiple control signals. In one embodiment, controller 412 provides at least two control signals. Driver 416, located on the same die as A/D converter 432, is configured to supply a current based on the control signal to open and close switch 424. A sensor, which may include in the case of FIG. 4, shunt resistor 426, operation amplifier 418 and A/D converter 432, is configured to provide a digital signal representative of the current to controller 412. The digital signal bypasses A/D converter 414.

Moving the digital signal processing functions that must be carried out by microprocessor 12 in FIG. 1 to driver and DSP chip 420 may have several advantages.

One of the advantages of this new partitioning illustrated in FIG. 4 is load current accuracy. For instance, compensation and calibration methods are available to microprocessor 412 which would not otherwise be available because the microprocessor is required to process high levels of data. Compensation and calibration of the signal can thus be carried out outside of microprocessor 412 but still be used therein. This increases the accuracy of the control signal provided to driver 416 and accordingly the accuracy current provided through switch 424 to $I_{LOAD}$.

Another advantage of the partitioning illustrated in FIG. 4 is that an end-of-line calibration is not needed. This decreases the production cost of the application.

Another advantage of the partitioning illustrated in FIG. 4 is that microprocessor 412 is not required to process high data levels. In view of this, a less costly microprocessor may be used for the same number of channels, or the number of channels may be increased without increasing the calculation power of the microprocessor.

Another advantage of the partitioning illustrated in FIG. 4 is that an additional and independent supervision path may be implemented by using the channels of the A/D converter inside microcontroller. The A/D converter (or the vacant inputs to the existing A/D converter 14 on microprocessor die 10) may be repurposed for such a supervision path or for other purposes.

Another advantage of the partitioning illustrated in FIG. 4 is that existing and proven control algorithms and strategies for SW-control applications (for instance those in microprocessor die 10 in FIG. 1) may be reused without difficulty. This facilitates uncomplicated replacement of, for example, driver chip 30 with driver and DSP chip 420 in FIG. 4 in existing assemblies.

Figure 5:
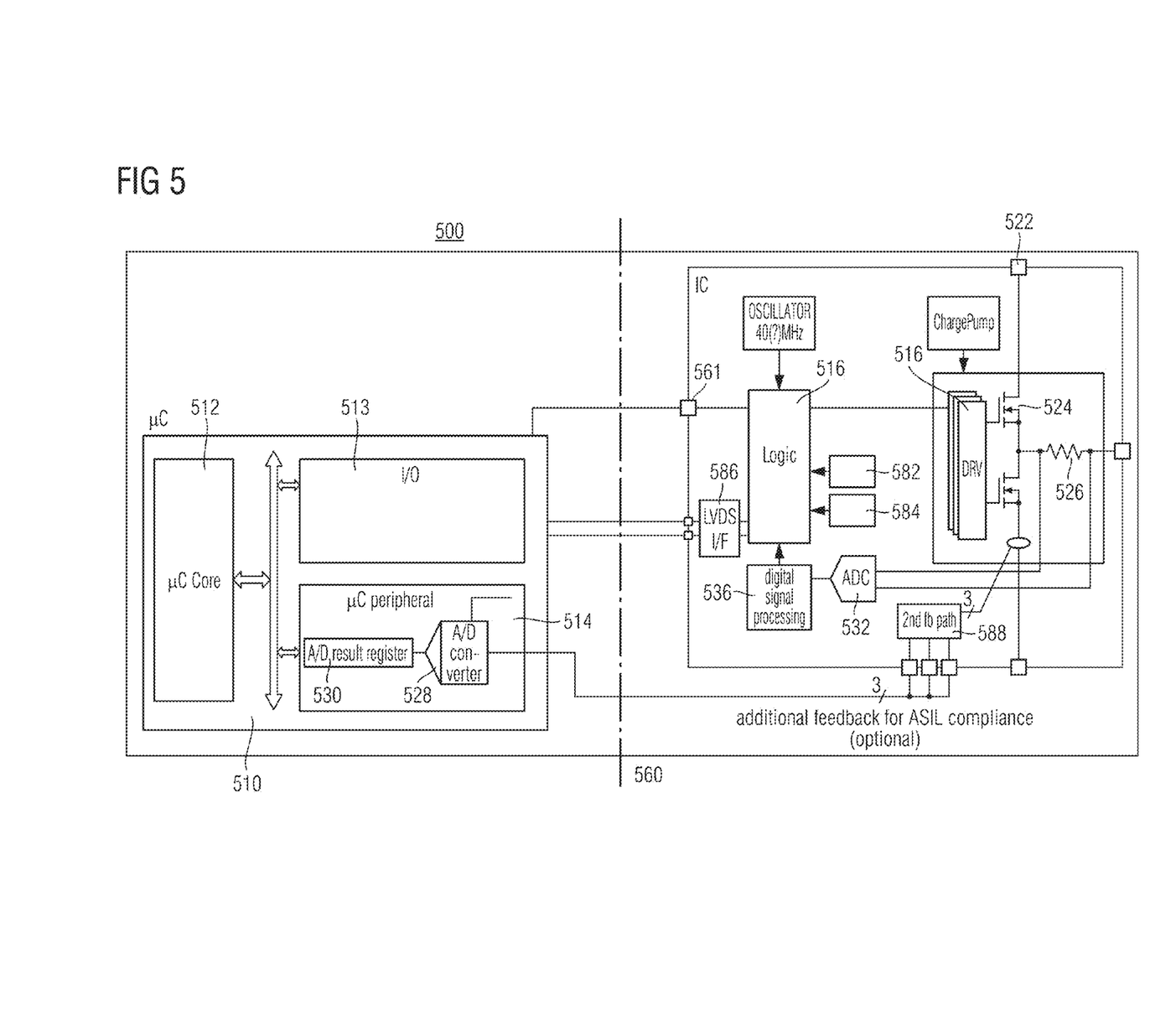
FIG. 5 shows, in accordance with a potential embodiment, a new approach with enhanced SW control chip architecture.

A further detailed embodiment of a new SW architecture is illustrated in FIG. 5. With reference to FIG. 5, two dies, i.e. microprocessor (μC) die 510 and driver and digital signal processor chip 520, are located on substrate 530. Die 510 and chip 520 may alternatively be located on separate substrates (illustrated by cut line 560). The microprocessor die 510 comprises a microprocessor core 512, Input/Output (I/O) interface 513 and microprocessor peripheral 514 comprising A/D converter 528 and A/D result register 530. Microprocessor peripheral 514 may be dedicated to microprocessor core 512. I/O interface 513 is connected to logic circuit 515 on driver and digital signal processor chip 520. Logic circuit 515 is connected to driver 516, which is configured to open and close switch 524. Switch 524 provides current to output 522 (to which an inductive load may be connected). In addition, the current passing through switch 524 may be measured off shunt resistor 526 and then converted into a digital signal by A/D converter 532 before being fed to logic circuit 515.

In the new SW (software)-control approach of FIG. 5, a current control algorithm in microprocessor core 512, for example, a Proportional-Integral (PI)-controller may control the external power stage or the current $I_{LOAD}$ through inductor 522. In operation, microprocessor core 512 may provide a control signal to logic circuit 515, which can in turn be configured to control a gate on switch 524. Temperature sensing circuitry 584 may be coupled to logic circuit 515. Closing switch 524 allows current to pass through it and effectively to inductor 522. By contrast, opening switch 524 stops current from passing through and effectively halts current to inductor 522. The current passing through switch 524 and inductor 522 ($I_{LOAD}$) may be measured, the measurement of the current being fed back into microprocessor 510 for analysis in the current control algorithm. Microprocessor 510 may receive digital information about the current being passed to the load from the first die. Microprocessor core 512 then adjusts the opening and closing accordingly so that the resulting average load current $I_{LOAD}$ corresponds to the predetermined (by the user) current set point $I_{SET}$.

A non-volatile memory (e.g. $E^2PROM$) 582 may hold calibration and compensation data that is written during production and end of line tests of the chip. This simplifies the implementation of the analog circuits due to reduced accuracy and temperature stability requirements, since a digital temperature dependent correction is able to compensate any non-ideal and non-linear effects.

Figure 6:
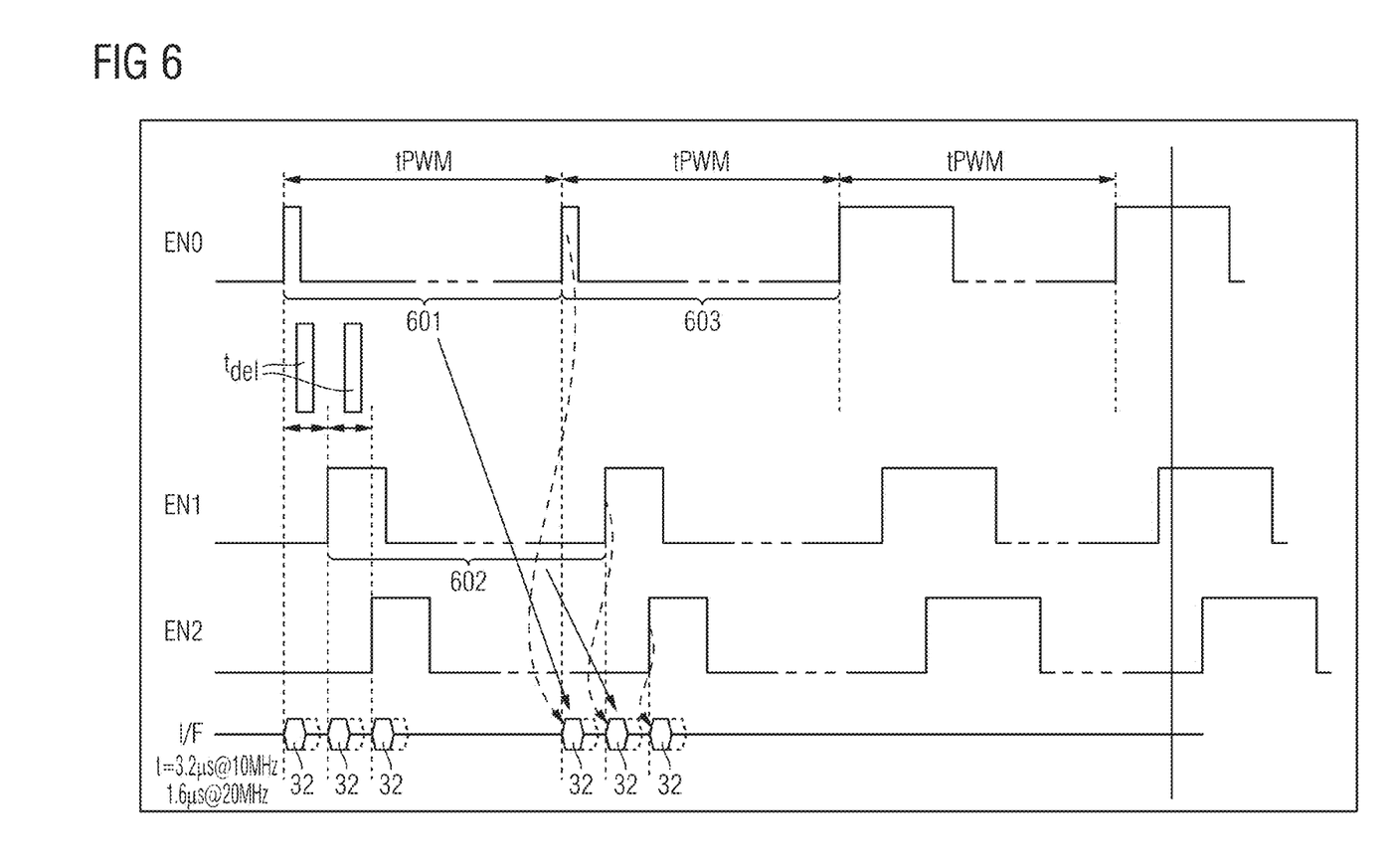
FIG. 6 shows an example of data transfer over the digital I/F.

In FIG. 5, the preprocessed data is sent to the microprocessor over a digital interface (e.g. low-voltage differential, "LVDS") 586. In one aspect of the disclosure, data may be transferred synchronously with the PWM frequency. This is illustrated in FIG. 6. In addition, the digital signal may include diagnostic information about the load, allowing the control signal to be adjusted midpulse during the duty cycle of the driver or for a subsequent pulse based on the diagnostic information.

Moreover, as mentioned with respect to FIG. 4, the A/D converter of the microprocessor can additionally be used for applications that need to fulfill a certain ASIL level according to ISO26262. Second feedback path 588 is provided in the proposed chip by an analog voltage that is proportional to the load current. Second feedback path 588 being connected to the A/D converter 528 of microprocessor chip 513 allows an independent diagnostic path for supervising the function of the current controller.

An advantage of the partitioning illustrated in FIG. 5 is that microprocessor core 512 is not required to process high data levels as logic circuit 515 has instead relieved core 512 of processing intensive actions. In view of this, a less costly microprocessor may be used for the same number of channels, or the number of channels may be increased without increasing the calculation power of the microprocessor.

FIG. 6 illustrates an example of data transfer over the Digital I/F 586 of FIG. 5.

In FIG. 6, EN0, EN1 and EN2 represent channels of the signal being sent from microprocessor 510 to input 561 of logic circuit 515. I/F in FIG. 6 represents the signal sent from digital interface 586 to microprocessor 510. The cycle 601 of channel EN0 has a time length of tPWM. Likewise, the cycle 602 of channel EN1 has a length. In FIG. 6 the time between sampling is illustrated by $t_{del}$. In this aspect of the disclosure, 32 bits are transferred at every rising edge of the enable signal of channels EN0, EN1, EN2. These 32 bits may hold diagnostic information of the respective power stage and the calculated average load current $I_{LOAD}$ of the previous PWM cycle. Based on this data the microprocessor can define the duty cycle of the subsequent 603, or current, PWM cycle.

One advantage of the approach illustrated in FIG. 6, besides unloading the microprocessor 510 of calculation tasks, is that a control algorithm in microprocessor 510 does not need to be changed, but rather remains flexible and easy-to-adapt. The control algorithm may be very sophisticated and only useable by experienced technicians (mostly Tier 1 persons and OEMs). FIGS. 5 and 6 illustrate an implementation with 3 channels which are switched in a staggered mode.

Figure 7:
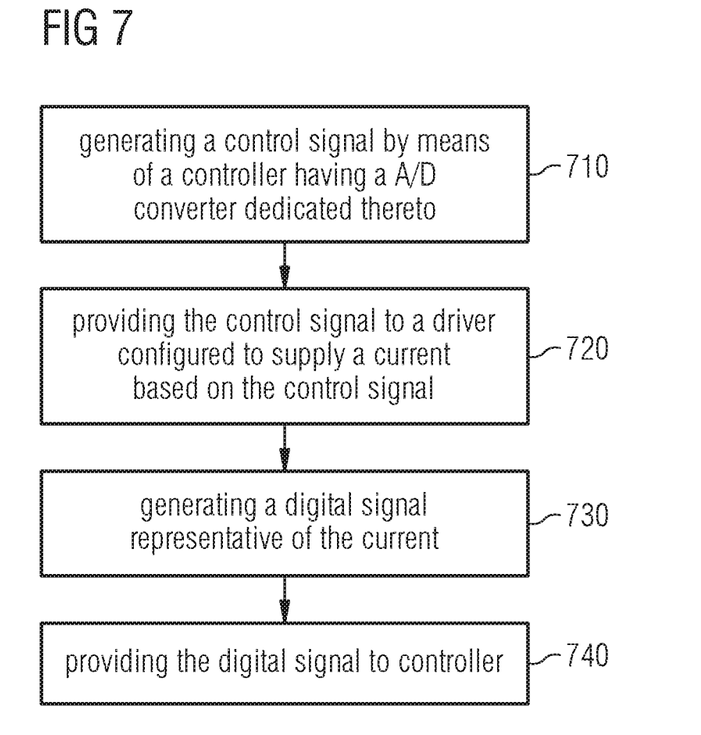
FIG. 7 depicts, in flowchart form, a method for controlling current.

In addition, a method for controlling current is disclosed in FIG. 7. The method includes generating a control signal by means of a controller having a A/D converter dedicated thereto 710. The method further includes providing the control signal to a driver configured to supply a current based on the control signal 720. The method further includes generating a digital signal representative of the current 730. The method further includes providing the digital signal to controller 740. Finally, in this method, the digital signal bypasses the A/D converter.

Figure 8:
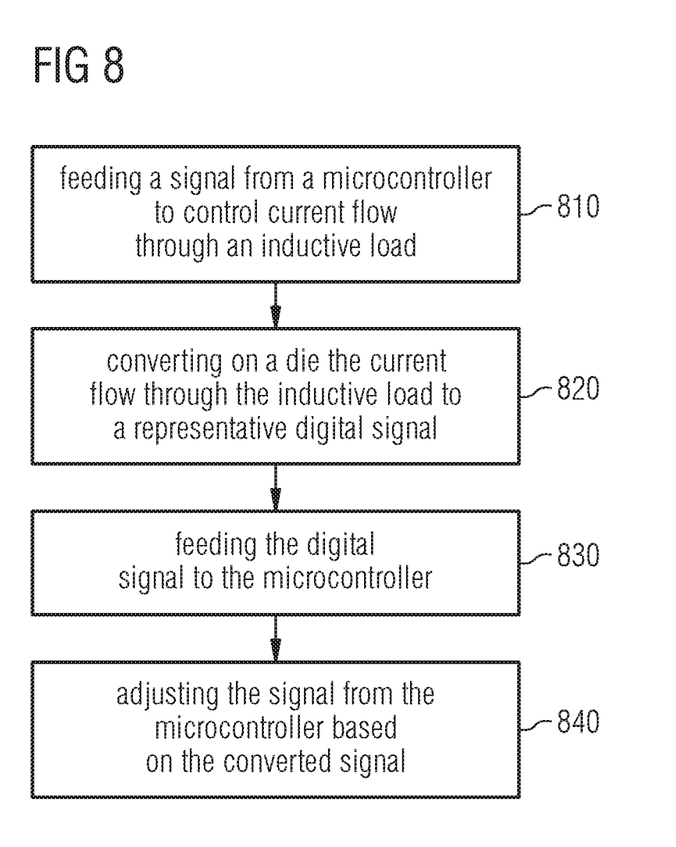
FIG. 8 depicts, in flowchart form, a method for adjusting current flowing through an inductive load.

In addition, a method for adjusting current flowing through an inductive load is disclosed in FIG. 8. The method includes feeding a signal from a microcontroller to control current flow through an inductive load 810. The method further includes converting on a die the current flow through the inductive load to a representative digital signal 820. The method further includes feeding the digital signal to the microcontroller 830. The method further includes adjusting the signal from the microcontroller based on the converted signal 840.

Figure 9:
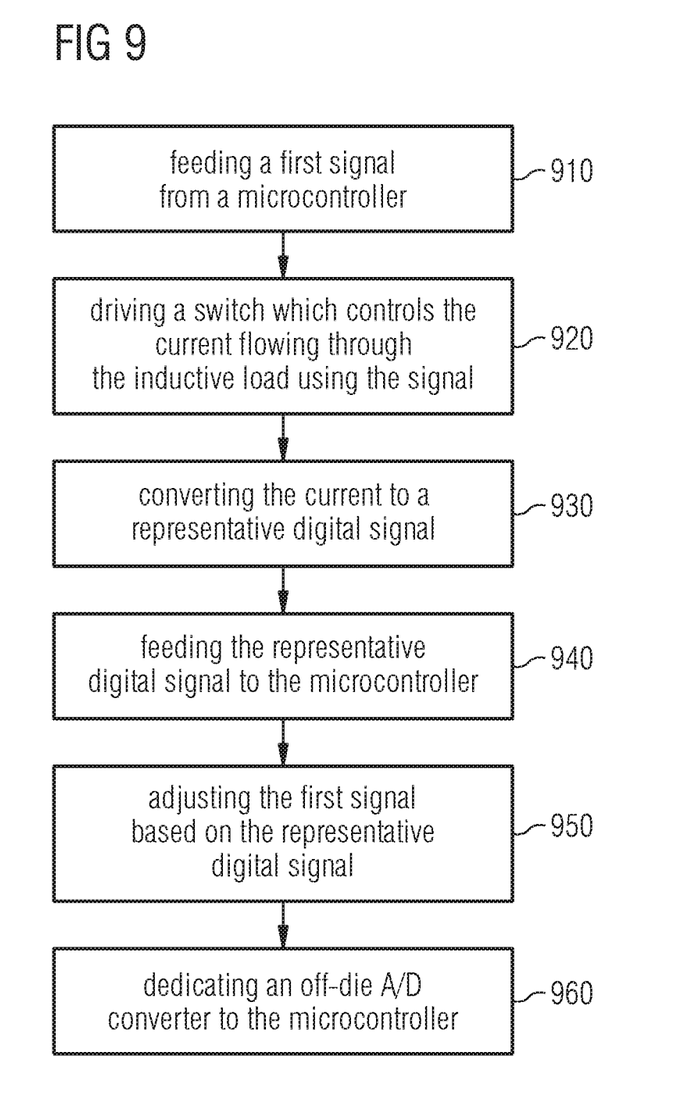
FIG. 9 depicts, in flowchart form, a method for monitoring current flowing through an inductive load driven through a bridge power stage in a pulse width modulation (PWM) mode.

In addition, method of monitoring current flowing through an inductive load driven through a bridge power stage in a pulse width modulation (PWM) mode is disclosed in FIG. 9. The method includes feeding a first signal from a microcontroller 910. The method further includes driving a switch which controls the current flowing through the inductive load using the signal 920. The method further includes converting the current to a representative digital signal 930. The method further includes feeding the representative digital signal to the microcontroller 940. The method further includes adjusting the first signal based on the representative digital signal 950. The method further includes dedicating an off-die A/D converter to the microcontroller 960.

The following examples pertain to further embodiments.

In Example 1, a current control system may include a controller configured to provide a control signal, an A/D converter dedicated to the controller, a driver configured to supply a current based on the control signal, a sensor configured to provide a digital signal representative of the current to the controller. In this example, the digital signal may bypass the dedicated A/D converter.

Example 2 may include the current control system of Example 1, where the current is supplied to an inductive load.

Example 3 may include the current control system of Example 1, where the digital signal is a signal converted from an analog signal representative of the current.

Example 4 may include the current control system of Example 3, further comprising a second A/D converter for converting the analog signal.

Example 5 may include the current control system of Example 1, where the driver is located on a first die.

Example 6 may include the current control system of Example 5, where the controller is located on a second die.

Example 7 may include the current control system of Example 6, where the controller and the dedicated A/D converter are a dedicated package.

Example 8 may include the current control system of Example 1, where the driver is configured to supply the current through pulse width modulation.

Example 9 may include the current control system of Example 1, where the controller is thermally isolated from the driver.

Example 10 may include the current control system of Example 1, further comprising a digital signal processor configured to preprocess the digital signal.

Example 11 may include the current control system of Example 10, where the digital signal processor includes temperature compensation circuitry.

Example 12 may include the current control system of Example 11, where the digital signal processor comprises an $E^2PROM$ configured to hold temperature compensation data.

Example 13 may include the current control system of Example 11, where the temperature compensation circuitry includes a temperature sensor and where the digital signal processor is configured to preprocess the digital signal in response to temperature changes of the circuit sensed by the temperature sensor.

Example 14 may include the current control system of Example 11, where the temperature compensation circuitry is environmentally coupled to a first die.

Example 15 may include the current control system of Example 10, where the digital signal processor is arranged on a first die.

Example 16 may include the current control system of Example 13, where the temperature sensor is arranged on a first die.

Example 17 may include the current control system of Example 1, where a second analog signal derived from the current flow to the inductive load independently feeds the dedicated A/D converter.

Example 18 may include the current control system of Example 17, where the second analog signal is a safety signal.

Example 19 may include the current control system of Example 1, where the digital signal includes diagnostic information.

Example 20 may include the current control system of Example 19, where the controller adjusts current flow to the inductive load through the driver based on the diagnostic information.

Example 21 may include the current control system of Example 20, where the controller is configured to adjust the control signal to the driver during the duty cycle of the driver.

Example 22 may include the current control system of Example 1, where the controller provides the control signal over two channels.

In Example 23, a method for controlling current may include generating a control signal by means of a controller having a A/D converter dedicated thereto, providing the control signal to a driver configured to supply a current based on the control signal, generating a digital signal representative of the current, providing the digital signal to controller. In this example, the digital signal may bypass the A/D converter.

Example 24 may include the current control system of Example 3, further comprising a second A/D converter for converting the analog signal.

Example 25 may include the method of Example 23, where the current is supplied to an inductive load.

Example 26 may include the method of Example 23, where the digital signal is a signal converted from an analog signal representative of the current.

Example 27 may include the method of Example 26, where a second A/D converter generates the digital signal Example 28 may include the method of Example 23, where the driver is located on a first die.

Example 29 may include the method of Example 28, where the controller is located on a second die.

Example 30 may include the method of Example 29, where the controller and the dedicated A/D are a dedicated package.

Example 31 may include the method of Example 23, where the driver is configured to supply the current through pulse width modulation to a switch.

Example 32 may include the method of Example 29, where the controller is thermally isolated.

Example 33 may include the method of Example 23, further comprising preprocessing the digital signal in response to temperature of the circuit sensed by temperature compensation circuitry.

Example 34 may include the method of Example 33, where the digital signal processor comprises an E2PROM configured to hold temperature compensation data.

Example 35 may include the method of Example 33, where the temperature compensation circuitry is environmentally coupled to a first die.

Example 36 may include the method of Example 33, where the temperature compensation circuitry is arranged on a first die.

Example 37 may include the method of Example 23, further comprising independently feeding a second analog signal derived from the current to the dedicated A/D converter.

Example 38 may include the method of Example 37, where the second analog signal is a safety signal.

Example 39 may include the method of Example 23, where the digital signal includes diagnostic information.

Example 40 may include the method of Example 29, where the controller adjusts the current flow to the inductive load through the driver based on the diagnostic information.

Example 41 may include the method of Example 23, where the driver adjusts the pulse during the duty cycle.

Example 42 may include the method of Example 23, where the control signal is generated over a first and second signal.

In Example 43, a circuit for controlling current through an inductive load may include a driver configured to adjust current flow to the inductive load, a microcontroller configured to control the driver, a first A/D converter located on a die configured to feed a digital signal to the microcontroller representative of the current flow to the inductive load, a second A/D converter coupled to the microcontroller. In this example, the second A/D converter may be arranged off-die.

Example 44 may include the circuit of Example 43, where the driver is located on the die.

Example 45 may include the circuit of Example 43, where the microcontroller is arranged off-die.

Example 46 may include the circuit of Example 43, where the driver is configured to control the current flow through pulse width modulation.

Example 47 may include the circuit of Example 43, further comprising a digital signal processor configured to preprocess the digital signal.

Example 48 may include the circuit of Example 47, where the digital signal processor includes temperature compensation circuitry.

Example 49 may include the circuit of Example 48, where the digital signal processor comprises an E2PROM configured to hold temperature compensation data.

Example 50 may include the circuit of Example 48, where the temperature compensation circuitry includes a temperature sensor and where the digital signal processor is configured to preprocess the digital signal in response to temperature changes of the circuit sensed by the temperature sensor.

Example 51 may include the circuit of Example 48, where the temperature compensation circuitry is environmentally coupled to the die.

Example 52 may include the circuit of Example 47, where the digital signal processor is arranged on the die.

Example 53 may include the circuit of Example 50, where the temperature sensor is arranged on the die.

Example 54 may include the circuit of Example 43, where an analog signal derived from the current flow to the inductive load independently feeds the second A/D converter.

Example 55 may include the circuit of Example 54, where the analog signal is a safety signal.

Example 56 may include the circuit of Example 43, where the digital signal includes diagnostic information.

Example 57 may include the circuit of Example 56, where the microcontroller adjusts the current flow to the inductive load based on the diagnostic information.

Example 58 may include the circuit of Example 43, where the microcontroller controls the driver over at least two channels.

In Example 59, a method for adjusting current flowing through an inductive load may include feeding a signal from a microcontroller to control current flow through an inductive load, converting on a die the current flow through the inductive load to a representative digital signal, feeding the digital signal to the microcontroller, and adjusting the signal from the microcontroller based on the converted signal.

Example 60 may include the method of Example 59, where the digital signal includes diagnostic information.

Example 61 may include the method of Example 60, where the diagnostic information includes information about the power to the load.

Example 62 may include the method of Example 60, where the diagnostic information includes the average load current of the current flow to the inductive load.

Example 63 may include the method of Example 60, comprising coupling an A/D converter to the microcontroller; where the second A/D converter is arranged off-die.

Example 64 may include the method of Example 59, where the microcontroller is arranged off-die.

Example 65 may include the method of Example 59, where the current is controlled by pulse width modulation.

Example 66 may include the method of Example 59, further comprising a digital signal processor configured to preprocess the digital signal.

Example 67 may include the method of Example 66, where the digital signal processor includes temperature compensation circuitry.

Example 68 may include the method of Example 66, where the digital signal processor comprises an E2PROM configured to hold temperature compensation data.

Example 69 may include the method of Example 67, where the temperature compensation circuitry includes a temperature sensor and where the digital signal processor is configured to preprocess the digital signal in response to temperature changes of the circuit sensed by the temperature sensor.

Example 70 may include the method of Example 67, where the temperature compensation circuitry is environmentally coupled to the die.

Example 71 may include the method of Example 66, where the digital signal processor is arranged on the die.

Example 72 may include the method of Example 67, where the temperature sensor is arranged on the die.

Example 73 may include the method of Example 63, further comprising feeding an analog signal derived from the current flow to the inductive load independently to the second A/D converter.

Example 74 may include the method of Example 73, where the analog signal is a safety signal.

Example 75 may include the method of Example 59, where the microcontroller controls the current flow over at least two channels.

In Example 76, a method of monitoring current flowing through an inductive load driven through a bridge power stage in a pulse width modulation (PWM) mode is disclosed. The method may include feeding a first signal from a microcontroller, driving a switch which controls the current flowing through the inductive load using the signal, converting the current to a representative digital signal, feeding the representative digital signal to the microcontroller, adjusting the first signal based on the representative digital signal, and dedicating an off-die A/D converter to the microcontroller.

Example 77 may include the method of Example 76, where a driver located on the die drives the switch.

Example 78 may include the method of Example 76, where the microcontroller is arranged off-die.

Example 79 may include the method of Example 77, where the driver is configured to control the switch through pulse width modulation.

Example 80 may include the method of Example 76, further comprising preprocessing the representative digital signal.

Example 81 may include the method of Example 80, where a digital signal processor preprocesses the digital signal and where the digital signal processor includes temperature compensation circuitry.

Example 82 may include the method of Example 81, where the digital signal processor comprises an E2PROM configured to hold temperature compensation data.

Example 83 may include the method of Example 81, where the temperature compensation circuitry includes a temperature sensor and where the digital signal processor is configured to preprocess the digital signal in response to temperature changes of the circuit sensed by the temperature sensor.

Example 84 may include the method of Example 81, where the temperature compensation circuitry is environmentally coupled to the die.

Example 85 may include the method of Example 81, where the digital signal processor is arranged on the die.

Example 86 may include the method of Example 76, further comprising independently feeding an analog signal derived from the current flow to the inductive load to the A/D converter.

Example 87 may include the method of Example 86, where the analog signal is a safety signal.

Example 88 may include the method of Example 76, where the representative digital signal includes diagnostic information.

Example 89 may include the method of Example 88, where the microcontroller adjusts the current flow to the inductive load based on the diagnostic information.

Example 90 may include the method of Example 76, where the first signal is generated over at least two control channels.

In Example 91, a circuit for controlling current through an inductive load is provided. The circuit may include a first and second die, a switch configured to pass current to the inductive load, a driver located on the first die configured drive a switch; a microcontroller located on the second die configured to control the driver. In this example the microcontroller may receive digital information about the current being passed to the load from the first die.

Example 92 may include the circuit of Example 91, where the driver is configured to control current flow through pulse width modulation.

Example 93 may include the circuit of Example 91, where comprising a digital signal processor located on the first die configured to preprocess the digital signal.

Example 94 may include the circuit of Example 93, where the digital signal processor includes temperature compensation circuitry.

Example 95 may include the circuit of Example 93, where the digital signal processor comprises an E2PROM configured to hold temperature compensation data.

Example 96 may include the circuit of Example 93, where the temperature compensation circuitry includes a temperature sensor and where the digital signal processor is configured to preprocess the digital signal in response to temperature changes of the circuit sensed by the temperature sensor.

Example 97 may include the circuit of Example 95, where the temperature compensation circuitry is environmentally coupled to the first die.

Example 98 may include the circuit of Example 93, where the temperature sensor is arranged on the first die.

Example 99 may include the circuit of Example 91, where an analog signal derived from the current flow to the inductive load independently feeds an A/D converter dedicated to the microcontroller.

Example 100 may include the circuit of Example 99, where the analog signal is a safety signal.

Example 101 may include the circuit of Example 91, where the digital information includes diagnostic information.

Example 102 may include the circuit of Example 101, where the microcontroller adjusts the current flow to the inductive load based on the diagnostic information.

Example 103 may include the circuit of Example 91, where the microcontroller controls the driver over at least two channels.

What is claimed is:
1. A current control system comprising:
a controller configured to provide a control signal;
an analog-to-digital (A/D) converter dedicated to the controller;
a driver configured to supply a current to an inductive load based on the control signal;
a sensor configured to provide a digital signal representative of the current to the controller, wherein the digital signal bypasses the dedicated A/D converter, and a first analog signal proportional to the current supplied to the inductive load independently feeds the dedicated A/D converter;
digital temperature compensation circuitry configured to preprocess the digital signal; and a current measuring circuit configured to measure the current supplied to the inductive load and produce the first analog signal based on a current measurement performed by the current measurement circuit, and wherein the current measurement circuit is separate from the sensor, wherein the controller and the dedicated A/D converter are integrated on a first chip, and the driver, the sensor, the digital temperature compensation circuitry and the current measuring circuit are integrated on a second chip different from the first chip.

2. The current control system of claim 1, wherein the digital signal is a signal converted from a second analog signal representative of the current, wherein the second analog signal is different from the first analog signal.

3. The current control system of claim 2, further comprising a second A/D converter for converting the second analog signal.

4. The current control system of claim 1, wherein the driver is located on a first die.

5. The current control system of claim 4, wherein the controller is located on a second die.

6. The current control system of claim 5, wherein the controller and the dedicated A/D converter are a dedicated package.

7. The current control system of claim 1, wherein the driver is configured to supply the current through pulse width modulation.

8. The current control system of claim 1, wherein the controller is thermally isolated from the driver.

9. The current control system of claim 1, further comprising a digital signal processor configured to preprocess the digital signal.

10. The current control system of claim 9, wherein the digital signal processor includes the digital temperature compensation circuitry.

11. The current control system of claim 10, wherein the digital signal processor comprises an E2PROM configured to hold temperature compensation data.

12. The current control system of claim 10, further comprising a temperature sensor, wherein the digital temperature compensation circuitry of the digital signal processor is configured to preprocess the digital signal in response to temperature changes of the circuit sensed by the temperature sensor.

13. The current control system of claim 12, wherein the temperature sensor is environmentally coupled to a first die.

14. The current control system of claim 12, wherein the temperature sensor is arranged on a first die.

15. The current control system of claim 9, wherein the digital signal processor is arranged on a first die.

16. The current control system of claim 1, wherein the first analog signal is a safety signal.

17. The current control system of claim 1, wherein the digital signal includes diagnostic information.

18. The current control system of claim 17, wherein the controller is configured to adjust a current flow to the inductive load through the driver based on the diagnostic information.

19. The current control system of claim 18, wherein the controller is configured to adjust the control signal to the driver during a duty cycle of the driver.

20. The current control system of claim 1, wherein:

the sensor comprises a shunt resistor coupled to a first terminal of a switch transistor of the driver, and a sensor A/D converter having a first input terminal coupled to a first terminal of the shunt resistor and a second input terminal coupled to a second terminal of the shunt resistor; and the current measurement circuit comprises a current sensor coupled to a second terminal of the switch transistor of the driver, wherein the second terminal of the switch transistor is different from the first terminal of the switch transistor.

21. A method for controlling current comprising:

generating a control signal using a controller having an analog-to-digital (A/D) converter dedicated thereto;

providing the control signal to a driver configured to supply a current to an inductive load based on the control signal;

generating a digital signal representative of the current supplied to the inductive load;

deriving an analog signal proportional to the current supplied to the inductive load;

independently feeding the derived analog signal to the dedicated A/D converter;

preprocessing the digital signal to produce a preprocessed digital signal; and providing the preprocessed digital signal to the controller, wherein the digital signal bypasses the A/D converter, wherein deriving the analog signal proportional to the current supplied to the inductive load comprises measuring the current supplied to the inductive load, wherein measuring the current supplied to the inductive load comprises using a first current measurement circuit, wherein generating the digital signal representative of the current comprises using a second circuit different from the first current measurement circuit, wherein the controller and the dedicated A/D converter are integrated on a first chip, and wherein the driver, the first current measurement circuit, and the second circuit are integrated on a second chip different from the first chip.

22. The method of claim 21, wherein preprocessing the digital signal comprises temperature compensating the digital signal.

23. The method of claim 21, wherein:

generating the digital signal representative of the current supplied to the inductive load comprises using a sensor comprising a shunt resistor coupled to a first terminal of a switch transistor of the driver, and a sensor A/D converter having a first input terminal coupled to a first terminal of the shunt resistor and a second input terminal coupled to a second terminal of the shunt resistor; and the first current measurement circuit comprises a current sensor coupled to a second terminal of the switch transistor of the driver, wherein the second terminal of the switch transistor is different from the first terminal of the switch transistor.

24. A current control system comprising:

a controller configured to provide a control signal;

an analog-to-digital (A/D) converter dedicated to the controller;

a driver configured to supply a current to an inductive load based on the control signal, wherein an analog signal proportional to the current supplied to the inductive load independently feeds the dedicated A/D converter;

a sensor configured to provide a digital signal representative of the current to the controller;

a digital signal processor configured to preprocess the digital signal; and a current measurement circuit configured to measure the current supplied to the inductive load and produce the analog signal based on a current measurement performed by the current measurement circuit, and wherein the current measurement circuit is separate from the sensor, wherein:

the controller and the dedicated A/D converter are integrated on a first chip, and the driver, the sensor, the digital signal processor and the current measurement circuit are integrated on a second chip different from the first chip.

25. The current control system of claim 24, wherein:

the sensor comprises a shunt resistor coupled to a first terminal of a switch transistor of the driver, and a sensor A/D converter having a first input terminal coupled to a first terminal of the shunt resistor and a second input terminal coupled to a second terminal of the shunt resistor; and the current measurement circuit comprises a current sensor coupled to a second terminal of the switch transistor of the driver, wherein the second terminal of the switch transistor is different from the first terminal of the switch transistor.

* * * * *